United States Patent
Lin

(10) Patent No.: US 7,394,252 B1
(45) Date of Patent: Jul. 1, 2008

(54) REGULARIZED GRAPPA RECONSTRUCTION

(75) Inventor: Fa-Hsuan Lin, Brookline, MA (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 11/743,739

(22) Filed: May 3, 2007

(51) Int. Cl.
*G01V 3/00* (2006.01)
(52) U.S. Cl. ................................ 324/309; 324/307
(58) Field of Classification Search ......... 324/300–322; 600/407, 410, 422; 455/567, 333; 379/429
See application file for complete search history.

(56) References Cited

U.S. PATENT DOCUMENTS

| | | | |
|---|---|---|---|
| 5,910,728 | A | 6/1999 | Sodickson |
| 6,326,786 | B1 | 12/2001 | Pruessmann et al. |
| 6,680,610 | B1 | 1/2004 | Kyriakos et al. |
| 6,717,406 | B2 * | 4/2004 | Sodickson ................. 324/307 |
| 6,943,547 | B2 | 9/2005 | Bydder et al. |
| 6,980,001 | B2 * | 12/2005 | Paley et al. ................. 324/318 |
| 7,053,613 | B2 * | 5/2006 | Lin ............................. 324/307 |
| 7,342,397 | B2 * | 3/2008 | Pruessmann et al. ........ 324/307 |

* cited by examiner

*Primary Examiner*—Brij B Shrivastav
(74) *Attorney, Agent, or Firm*—Quarles & Brady LLP

(57) ABSTRACT

The invention relates to a method for reconstructing a fully sampled k-space data set. An undersampled GRAPPA scan of a subject is performed in a parallel MRI system using a set of receiver coil elements and corresponding receiver channels to obtain a reduced k-space data set. Autocalibration samples in k-space for each receiver channel are obtained and a GRAPPA reconstruction kernel β is calculated from the reduced k-space data set and autocalibration samples. Missing k-space lines are reconstructed to obtain a reconstructed k-space data set which together with the reduced k-space data set fully samples each channel of k-space. Each line is reconstructed using a regularized GRAPPA reconstruction if prior k-space information is available and using an unregularized GRAPPA reconstruction if no prior k-space information is available. The regularized GRAPPA reconstructions are performed preferably using a Tikhonov regularization framework.

20 Claims, 11 Drawing Sheets

REGULARIZED GRAPPA RECONSTRUCTION

STATEMENT REGARDING FEDERALLY SPONSORED RESEARCH

This invention was made with government support under Grant Nos. R01 HD040712 and P41 RR14075 awarded by the National Institutes of Health. The United Sates Government has certain rights in this invention.

CROSS REFERENCES TO RELATED APPLICATIONS

Not applicable.

FIELD OF THE INVENTION

The field of the invention is magnetic resonance imaging (MRI) methods and systems. More particularly, the invention relates to regularized GRAPPA reconstruction of parallel MRI k-space data.

BACKGROUND OF THE INVENTION

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Lamor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known image reconstruction techniques.

Depending on the technique used, many NMR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel imaging". Parallel imaging techniques use spatial information form arrays of RF receiver coils to substitute for the encoding which would otherwise have to be obtained in a sequential fashion using RF pulses and field gradients (such as phase and frequency encoding). Each of the spatially independent receiver coils of the array carriers certain spatial information and has a different sensitivity profile. This information is utilized in order to achieve a complete location encoding by a combination of the simultaneously acquired coil data from the separate receiver coils. Specifically, parallel imaging techniques undersample k-space by reducing the number of phase-encoded lines acquired by increasing the distance between these lines while keeping the maximal extent covered in k-space fixed. The combination of the separate NMR signals produced by the separate receiver coils enables a reduction of the acquisition time required for an image (in comparison to conventional k-space data acquisition) by a factor which in the most favorable case equals the number of the receiver coils. Thus the use of multiple receiver coils acts to multiply imaging speed, without increasing gradient switching rates or RF power.

Two categories of such parallel imaging techniques which have recently been developed and applied to in vivo imaging are SENSE (SENSitivity Encoding) and SMASH (SiMultaneous Acquisition of Spatial Harmonics).

With SENSE, the undersampled k-space data is first Fourier transformed to produce an aliased image from each coil, and then the aliased image signals are unfolded by a linear transformation of the superimposed pixel values.

With SMASH, the omitted k-space lines are filled in or reconstructed prior to Fourier transformation, by constructing a weighted combination of neighboring lines acquired by the difference receiver coils. SMASH requires that the spatial sensitivity of the coils be determined, and one way to do so is by "autocalibration" which entails the use of variable density k-space sampling. A recent important advance to SMASH techniques using autocalibration is a technique known as GRAPPA (GeneRalized Autocalibrating Partially Parallel Acquisitions), introduced by Griswold et al. This technique is described in U.S. Pat. No. 6,841,998 as well as in the article titled "Generalized Autocalibrating Partially Parallel Acquisitions (GRAPPA)," by Griswold et al. and published in *Magnetic Resonance in Medicine* 47:1202-1210 (2002).

Using these original GRAPPA techniques, lines near the center of k-space are sampled at the Nyquist frequency (in comparison to the greater spaced lines at the edges of k-space). These so-called autocalibration signal (ACS) lines are then used to determine the weighting factors that are used to reconstruct the missing k-space lines. In particular, a linear combination of individual coil data is used to create the missing lines of k-space. The coefficients for the combination are determined by fitting the acquired data to the more highly sampled data near the center of k-space.

In dynamic MRI applications, such as functional imaging, interventional imaging and cardiac imaging, there has long been a need in the art for methods and apparatus that provide high quality images, i.e., high-resolution and signal to noise ratio (SNR). Thus, in addition to scan time, it is also desirable to improve the SNR of acquired image data.

SUMMARY OF THE INVENTION

An object of the present invention is to provide a method for reconstructing missing k-space data in a GRAPPA MRI scan using prior k-space information in a Tikhonov regularization framework so that higher quality images can be produced. When prior k-space information, such as autocalibration data, is available, a regularized GRAPPA reconstruction can provide various advantages. For example, for a static imaging sequence, aliasing artifacts at high acceleration rates can be reduced, and for a dynamic imaging sequence, motion artifact sensitivity can be reduced and an improvement in detection of function activation is possible.

The regularization is preferably performed using a Tikhonov regularization framework. In particular, an undersampled scan of a subject is performed in a parallel MRI system using a set of receiver coil elements and corresponding receiver channels to obtain a reduced k-space data set. Autocalibration samples in k-space for each receiver channel are obtained and a GRAPPA reconstruction kernel $\beta$ is calculated from the reduced k-space data set and the autocalibration samples. The missing k-space lines are reconstructed to obtain a reconstructed k-space data set which together with the reduced k-space data set fully samples each channel of k-space. Each line is reconstructed using a regularized GRAPPA reconstruction if prior k-space information is available (for example, the autocalibration samples) or using an unregularized GRAPPA reconstruction if no prior information is available. A regularized GRAPPA reconstruction is performed using the Tikhonov regularization framework in order to allow a tradeoff between reliance on the conventional GRAPPA reconstruction and the replication of the prior k-space information. An optimal regularization parameter is determined in order to constrain the reconstructed k-space data within a predetermined extent from the prior k-space information.

DESCRIPTION OF THE PREFERRED EMBODIMENT

Figure 1:
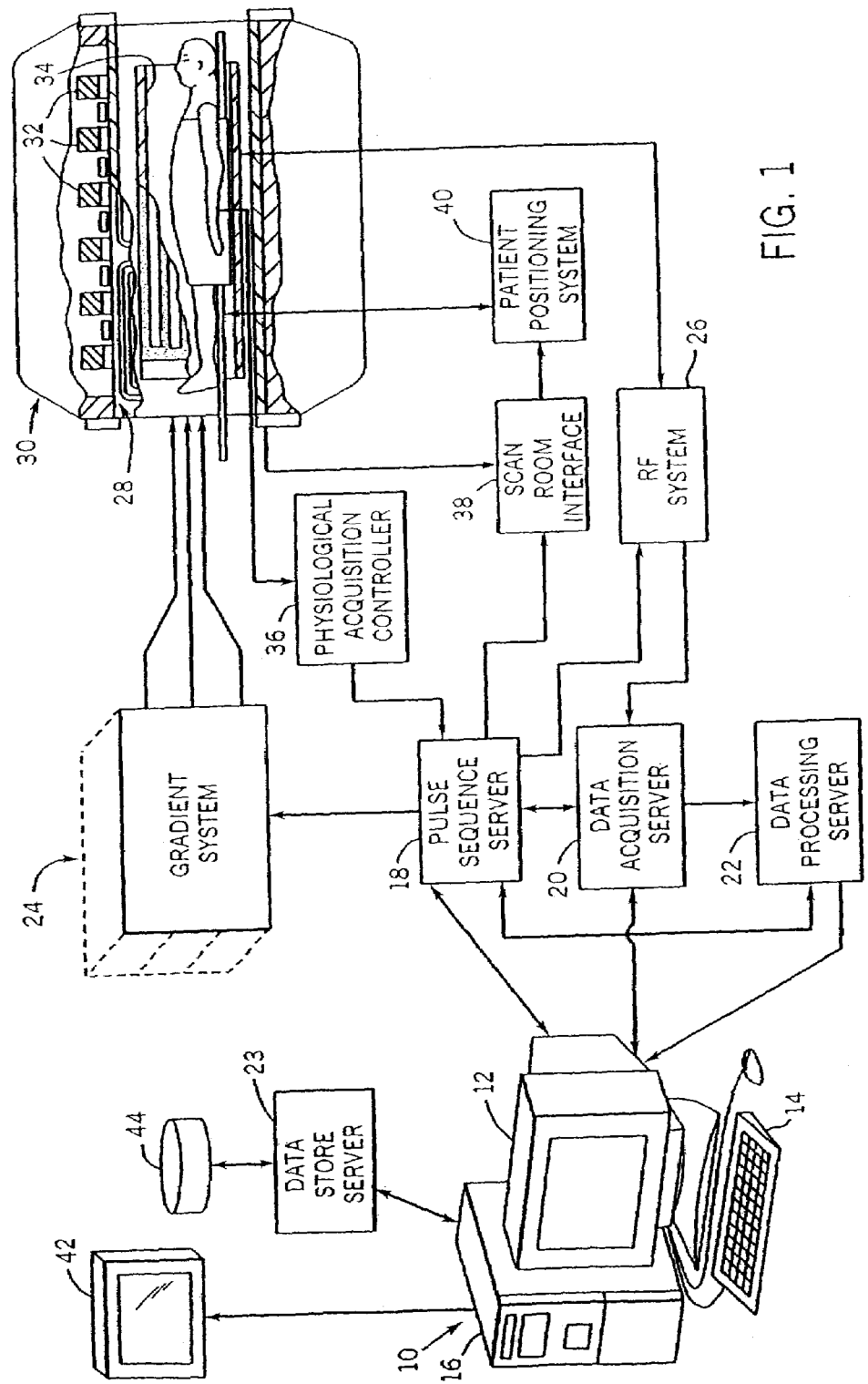
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers; a pulse sequence server 18; a data acquisition server 20; a data processing server 22, and a data store server 23. In the preferred embodiment the data store server 23 is performed by the workstation processor 16 and associated disc drive interface circuitry. The server 18 is performed by a separate processor and the servers 20 and 22 are combined in a single processor. The workstation 10 and each precessor for the serves 18, 20 and 22 are connected to an Ethernet communications network. This network conveys data that is downloaded to the servers 18, 20 and 22 from the workstation 10, and it conveys data that is communicated between the servers.

The pulse sequence server 18 functions in response to instructions downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32, a whole-body RF coil 34. In the preferred embodiment, RF coil 34 includes a coil array having a plurality of coil elements wherein each coil element is used to receive a separate NMR signal.

The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses are amplified and applied to the whole body RF coil 34 to perform a prescribed RF excitation field. In other embodiments the RF pules may be applied to one or more local coils.

The resulting signals radiated by the excited nuclei in the patient are sensed by the RF coil array. The received signals are at or around the Larmor frequency, and are amplified, demodulated, filtered and digitized under direction of commands produced by the pulse sequence server 18. In particular, the RF system 26 includes a plurality of RF receiver channels, with a separate channel corresponding to each coil element in the coil array. Each RF receiver channel includes an RF amplifier that amplifies the NRM signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2}, \qquad \text{Equation 1}$$

and the phase of the received NMR signal may also be determined:

$$\phi=\tan^{-1}Q/I. \qquad \text{Equation 2}$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates in response to instructions downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. Further, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with instructions downloaded from the workstation 10. Such processing may include, for example: reconstruction of k-space data sets, Fourier transformation of raw k-space NMR data to produce two or three-dimensional images, the application of filters to a reconstructed image, the performance of a back-projection image reconstruction of acquired NMR data, the calculation of functional MR images; the calculation of motion or flow images, etc. As will be described below, the data processing server 22 also performs steps of the present invention.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
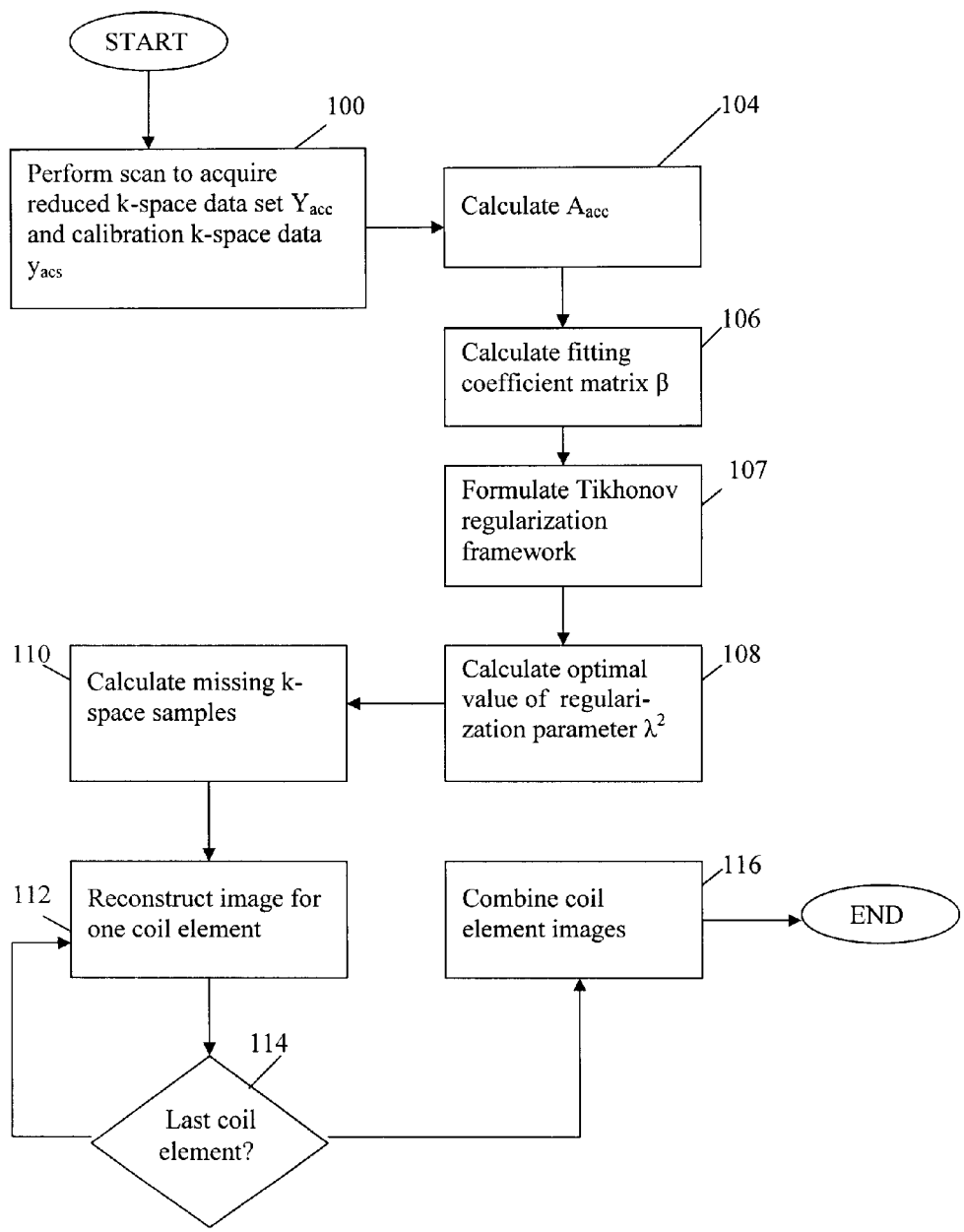
FIG. 2 is a flow chart for acquiring and processing MRI data obtained from a static GRAPPA scan in accordance with the present invention using the system of FIG. 1.

Referring now to FIG. 2, a flow chart is shown for acquiring and processing MRI data for a static GRAPPA scan using the system of FIG. 1. As indicated at step 100, an undersampled scan of a subject is performed by the MRI system to acquire a reduced k-space data set in each channel, which collectively are denoted by $Y_{acc}$, and to obtain calibration k-space data samples in each receiver channel, which collectively are denoted by $y_{acs}$. As explained below, any k-space data that is missing from the reduced k-space data set is reconstructed using regularized or unregularized GRAPPA reconstructions to obtain a reconstructed k-space data set which together with $Y_{acc}$ fully samples k-space.

In the following discussion, reference is made to the one-dimensional k-space diagrams such as those shown in FIGS. 3(a)-(c), FIGS. 5(a)-(b), and FIGS. 6(a-6(e). In these figures, sampled lines of k-space data in a single channel are designated by solid or filled in circles ("●"), whereas unfilled circles ("○") each indicate a line of k-space in a single channel that has not been acquired but is to be reconstructed. Further, lines of acquired auto-calibration scan (ACS) data are designated by a circle having a number within it.

Figure 3A:
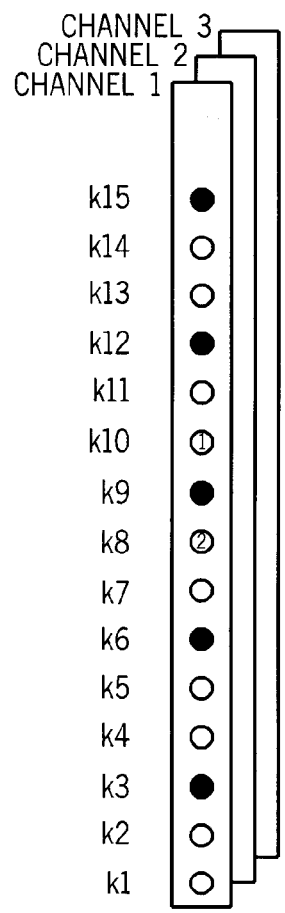
FIGS. 3(a)-3(c) are simplified schematic k-space illustrations of reduced k-space data acquisition, k-space data reconstruction, and reconstruction results for a static scan using the method of FIG. 2.

For example, referring to FIG. 3(a), a simplified k-space data acquisition is schematically illustrated for three channels with a static GRAPPA scan. As stated, each filled in circle represents a line of acquired or sampled k-space data corresponding to one coil element or receiver channel, and two autocalibration lines are also indicated at lines k10 and k8. The unfilled circles represent k-space data not acquired and which needs to be reconstructed. Here $Y_{acc}$ is the reduced k-space data set obtained using an acceleration or reduction factor of 3, and includes data from lines k3, k6, k9, k12, and k15 (counting from the bottom) for each of the three channels, and $y_{acs}$ is the k-space autocalibration data including data from two lines k8 and k10 at the center of k-space for each of the three channels. In this static scan, $Y_{acc}$ and $y_{acs}$ are acquired during the same scan. K-space data that is missing from the acquired reduced k-space data set $Y_{acc}$, in this case lines k1, k2, k4, k5, k7, k8, k10, k11, k13, k14, are each reconstructed using regularized or unregularized GRAPPA reconstructions as described below.

At step 104, the pseudo inverse of $Y_{acc}$ is calculated, preferably using a singular value decomposition of $Y_{acc}$. In particular, given $Y_{acc}$, its singular value decomposition (SVD) can be calculated using known methods and can be written as follows:

$$Y_{acc} = U_{acc} S_{acc} V^H_{acc} \qquad \text{Equation 3}$$

where $Y_{acc}$ is an m-by-n matrix whose entries come from the field K, which is either the field of real numbers or the field of complex numbers, where $U_{acc}$ is an m-by-m unitary matrix over K, the matrix $S_{acc}$ is m-by-n with nonnegative numbers on the diagonal and zeros off the diagonal, and $V_{acc}^H$ denotes the conjugate transposed of $V_{acc}$; an n-by-n unitary matrix over K.

Then the pseudo inverse of $Y_{acc}$, denoted by $A_{acc}$, can be determined as follows:

$$A_{acc} = V_{acc}(S_{acc})^{-1} U_{acc}^H \qquad \text{Equation 4}$$

At step 106, a reconstruction kernel or fitting coefficient matrix $\beta$ is calculated using the calibration k-space data from each coil element, namely $y_{acs}$ and the acquired reduced k-space data set $Y_{acc}$, using known conventional GRAPPA calculations, such as described in U.S. Pat. No. 6,841,998.

At step 107, a Tikhonov regularization framework is formulated to perform regularized GRAPPA reconstruction of k-space data. Such a framework is used to minimize a cost function that includes $(A_{acc} y_{GRAPPA} - \beta)$ and $\lambda^2(y_{GRAPPA} - y^0_{GRAPPA})$, where $y^0_{GRAPPA}$ is prior information, and $\lambda^2$ is a regularization parameter.

In particular, it is desired to compute:

$$y^\lambda_{GRAPPA} = \underset{y_{GRAPPA}}{\operatorname{argmin}} \{\|A_{acc} y_{GRAPPA} - \beta\|_2 + \lambda^2 \|y_{GRAPPA} - y^0_{GRAPPA}\|_2\} \qquad \text{Equation 5}$$

The above cost function attempts to constrain the solution $y_{GRAPPA}$ to within a certain distance of the prior information, depending on the value of the regularization parameter. A traditional or unregularized GRAPPA technique would be equivalent to the above with the regularization parameter set to zero, which means that the prior information is simply ignored. as the regularization parameter $\lambda^2$ increases in value, more dependency is placed on the prior information. This leads to a smaller discrepancy between the prior information and the solution at the cost of a larger difference between the model prediction and observation. Similarly, a smaller regularization parameter decreases the difference between model prediction and observation at the cost of a larger discrepancy between the prior information and the solution. The L-2 norm is used to quantify the difference between these vectors.

Plotting model error versus prior error for a range of $\lambda^2$ shows the available tradeoffs between the two types of error. Thus, at step 108, an optimal value for the regularization parameter is determined, preferably using an L-curve method, such as described in the paper titled "The L-curve and its use in the numerical treatment of inverse problems" by P. C. Hansen. In particular, the model error ρ and prior error η can be calculated using the following two equations:

$$\rho \equiv \|\beta - A_{acc} y^\rho_{GRAPPA}\| = \sum_{j=1}^{n} ((1-f_j) u_j^H \beta)^2 \qquad \text{Equation 6}$$

$$\eta \equiv \|y^\rho_{GRAPPA} - y^{0\rho}_{GRAPPA}\| = \sum_{j=1}^{n} \left( f_j \left( \frac{u_j^H \tilde{\beta}}{s_{jj}} - y^{\rho 0}_{jGRAPPA} \right) \right)^2 \qquad \text{Equation 7}$$

where, $Y^{\rho 0}_{j\,GRAPPA}$ is the j-th element of prior $y^{\rho 0}_{GRAPPA}$, and where singular value decomposition is used to compute the left singular vectors $u_j$, right singular vectors $v_j$, and singular values $S_{jj}^2$ of $A_{acc}$ with the singular values and singular vectors indexed by j, such that ƒj is defined by:

$$f_j = \frac{s_{jj}^2}{s_{jj}^2 + \lambda^2} \qquad \text{Equation 8}$$

The optimal regularization parameter is defined as that which strives to minimize and balance the two error terms. This occurs in the elbow of the L-curve, mathematically, where the curvature is at its minimum.

Next, at step 110, the missing k-space samples are calculated. For each k-space line missing from the reduced k-space data set $Y_{acc}$, if not other prior information is available, then standard or unregularized GRAPPA reconstructions are performed to fill in the missing line of k-space data. An unregularized GRAPPA reconstruction is equivalent to the case where $\lambda^2$ is equal to zero. If prior information is available, a regularized GRAPPA reconstruction is performed using the determined value for the optimal regularization parameter $\lambda^2$.

Figure 3B:
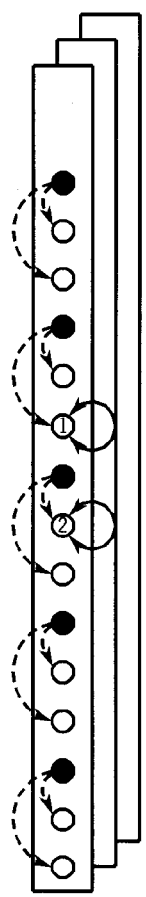
Figure 3C:
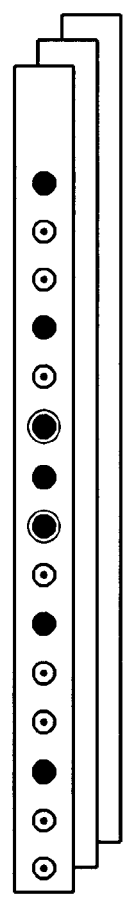

With reference to FIGS. 3(b) and 3(c), for the locations in the reconstructed k-space data set which correspond to locations of autocalibration samples included in $y_{acs}$, namely lines k8 and k10, since prior information is available, corresponding k-space data is reconstructed using a regularized GRAPPA reconstruction to obtain a k-space matrix vector denoted by $y_{GRAPPA}$. The incorporation of prior information is indicated by a solid arrow in FIG. 3(b), while the dashed arrows indicate standard GRAPPA reconstruction. K-space lines k1, k2, k4, k5, k7, k11, k13, and k14 represent k-space data which is reconstructed using unregularized GRAPPA reconstruction, since prior information is not available. FIG. 3(c) shows the results, with a circle with a dot within representing a line of unregularized GRAPPA reconstructed k-space data, and with a solid circle surrounded by another circle representing a line of regularized GRAPPA reconstructed k-space data.

In particular, once an optimal regularization parameter is determined, the following solution of the cost function is determined:

$$y^\lambda_{GRAPPA} = \sum_{j=1}^{n} \left( f_j \left( \frac{u_j^H \beta}{s_{jj}} + (1-f_j) v_j^H y^0_{GRAPPA} \right) v_j \right) \qquad \text{Equation 9}$$

This leads to the following matrix presentations:

$$y^\lambda{}_{GRAPPA} = VTU^H \beta + V\Phi V^H y^0{}_{GRAPPA} \qquad \text{Equation 10}$$

where $$\Gamma_{jj} = \frac{f_j}{s_{jj}} = \frac{s_{jj}}{s_{jj}^2 + \lambda^2} \text{ and} \qquad \text{Equation 11}$$

$$\Phi_{jj} = 1 - f_j = \frac{\lambda^2}{s_{jj}^2 + \lambda^2} \qquad \text{Equation 12}$$

Thus, at step 110, the above equations 7-10 are used with the determined optimal value for the regularization parameter to calculate the missing k-space samples for all channels using regularized or unregularized GRAPPA.

At steps 112 and 114, images can be reconstructed for each coil element in the coil array. At step 116, the coil element images from each separate channel can be combined to produce an image of the scanned subject. These are conventional GRAPPA processing steps to reconstruct an image from the completed k-space data sets for each channel.

Figure 4:
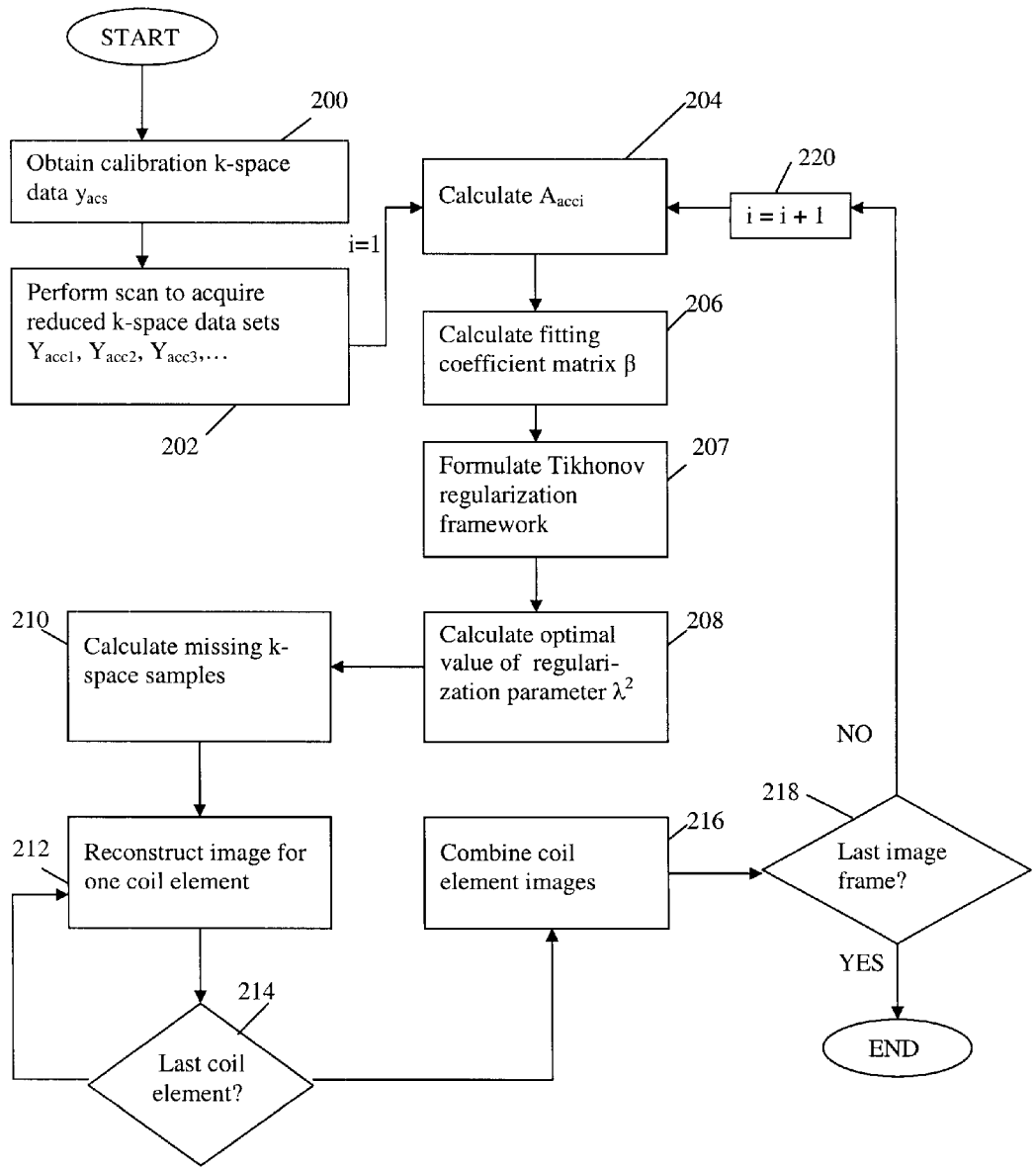
FIG. 4 is a flow chart for acquiring and processing MRI data obtained from a dynamic GRAPPA scan in accordance with the present invention using the system of FIG. 1.

Referring now to FIG. 4, another flow chart is shown for acquiring and processing MRI data for a dynamic GRAPPA scan using the system of FIG. 1. In particular, at step 200, a calibration scan of a subject is performed to obtain a calibration data set $y_{acs}$. At step 202, accelerated scans are performed to acquire a time series of undersampled or reduced k-space data sets denoted by $Y_{acc1}$, $Y_{acc2}$, $Y_{acc3}$, etc. Such a time series would correspond to a series of image frames. Again, k-space data that is missing from the reduced k-space data set is reconstructed using regularized and unregularized GRAPPA reconstructions to obtain a reconstructed k-space data set which together with $Y_{acci}$ fully samples k-space.

Figure 5A:
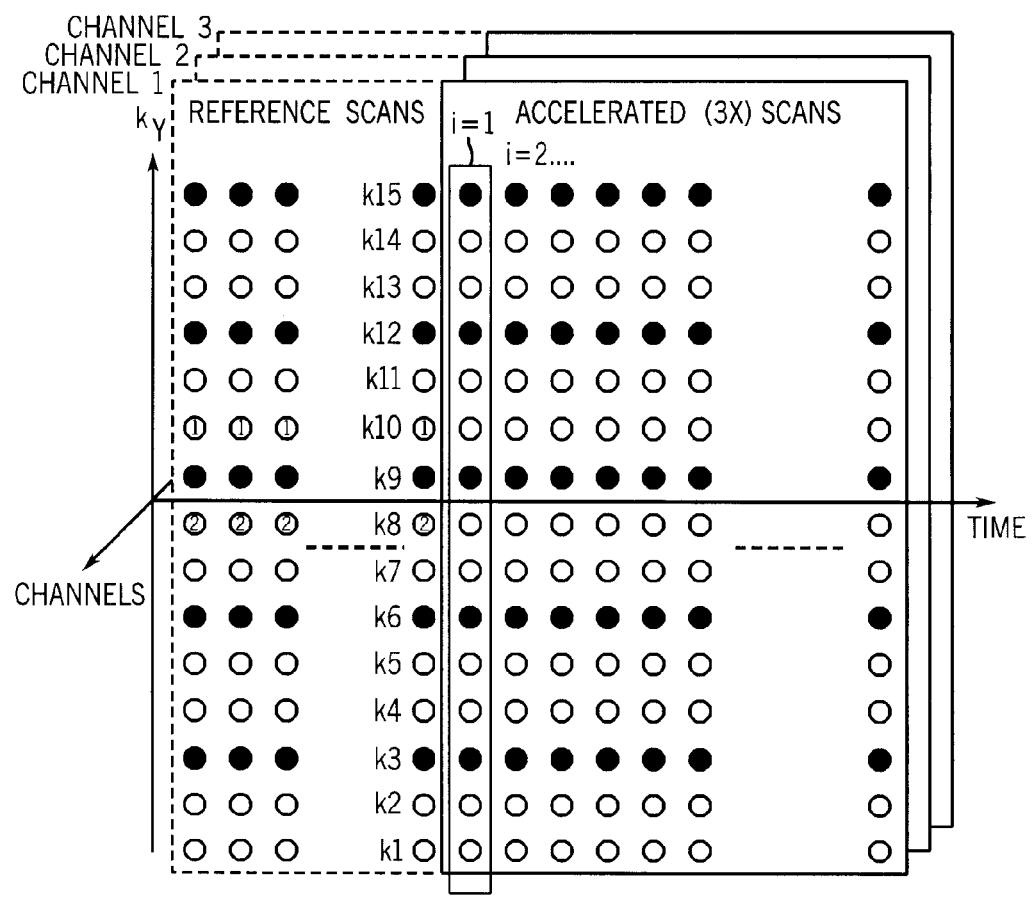
FIGS. 5(a)-5(b) are schematic k-space illustrations of reduced k-space data acquisition and k-space reconstruction using the method of FIG. 4.
Figure 5B:
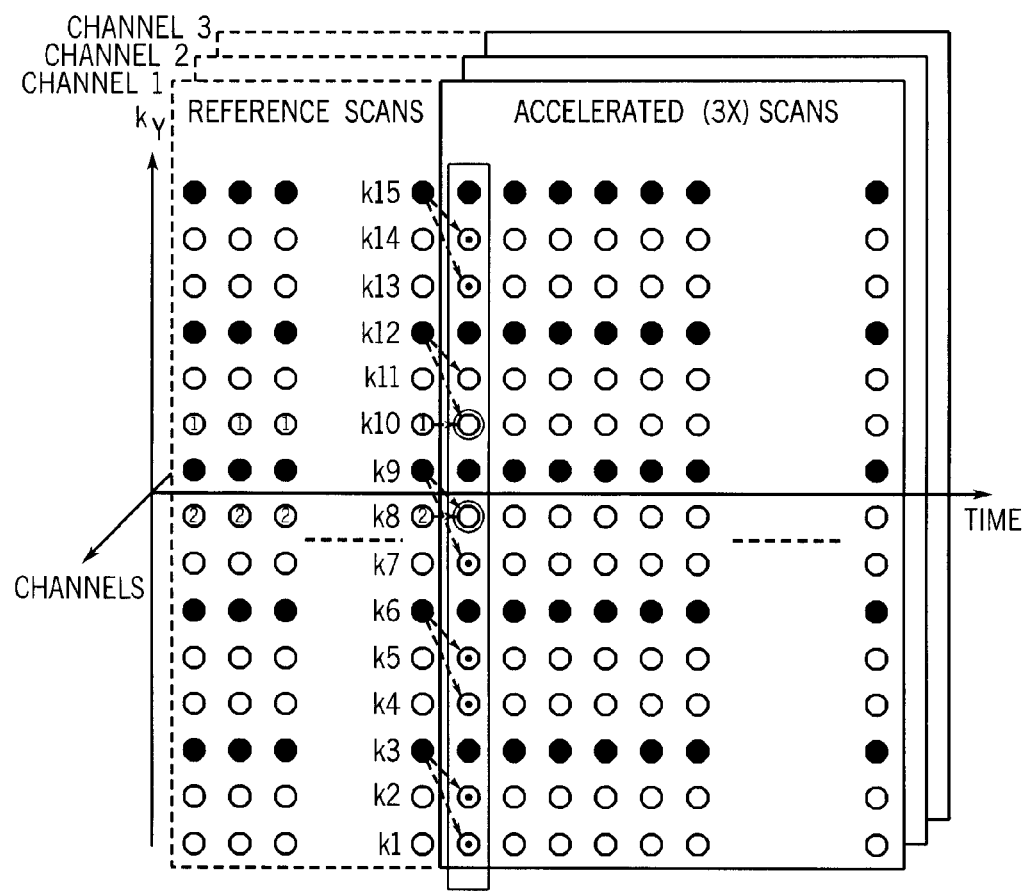

For example, as schematically illustrated in FIG. 5(a), an acquired k-space data set for the calibration or reference scan is illustrated, with data sets obtained for each of the three channels. At least one reference scan and a plurality of accelerated scans are performed. The reference scan obtains ACS calibration lines for lines k8 and k10 (counting from the bottom). For the accelerated scans, each filled in circle represents acquired k-space data corresponding to a single channel. A series of accelerated scans are obtained for an RF coil array having three coil elements again using an acceleration or reduction factor of 3. $Y_{aci}$ is the reduced k-space data set obtained using an acceleration or reduction factor of 3, and includes data from lines k3, k6, k9, k12, and k15 for the three channels, and $y_{acs}$ is the k-space calibration data including data from lines k8 and k10 for the three channels obtained from the reference scan. K-space data that is missing from the acquired reduced k-space data set, in this case lines k1, k2, k4, k5, k7, k8, k10, k11, k13, k14 are reconstructed, as described below.

At step 204, the pseudo inverse of $Y_{acci}$ is calculated to obtain $A_{acci}$, using the same process described above with respect to step 104. At step 205, a reconstruction kernel or fitting coefficient matrix β is calculated using the calibration k-space data from each coil element, namely $y_{acs}$ and the acquired reduced k-space data set $Y_{aci}$, using known GRAPPA calculations, similar to step 105.

At step 207, a Tikhonov regularization framework is formulated to perform regularized GRAPPA reconstruction of k-space data, as described above with respect to step 170. At step 208, an optimal value for the regularization parameter $\lambda^2$ is calculated as previously described.

Next, at step 210, the missing k-space samples are determined for each time frame i of accelerated scan data. For each missing k-space line, if no other prior information is available, then standard or unregularized GRAPPA reconstructions are performed to fill in the missing line of k-space data. An unregularized GRAPPA reconstruction is equivalent to the case where $\lambda^2$ is equal to zero. If prior information is available, a regularized GRAPPA reconstruction is performed as described above using the determined value for the optimal regularization parameter $\lambda^2$. With reference to the example shown in FIG. 5(b), for locations in the reconstructed k-space data set which correspond to locations of autocalibration samples included in $y_{acs}$, namely lines k8 and k10, since prior information is available, corresponding k-space data is reconstructed using a regularized GRAPPA reconstruction to obtain a k-space matrix vector denoted by $y_{GRAPPA}$. The incorporation of prior information is indicated by a solid arrow in FIG. 5(b), while the dashed arrows indicate standard GRAPPA reconstruction. The k-space lines k1, k2, k4, k5,k7, k11, k13, and k14 represent k-space data which is reconstructed using unregularized GRAPPA reconstruction, since prior information is not available. Thus, a circle with a dot within represents a line of unregularized GRAPPA reconstructed k-space data, and with a solid circle surrounded by another circle represents a line of regularized GRAPPA reconstructed k-space data.

Thus, the above equations are used at step 210 to calculate the missing k-space samples using regularized or unregularized GRAPPA for all channels.

At steps 212 and 214, images are reconstructed for each coil element in the coil array. At step 216, the coil element images are combined to produce an image of the scanned subject corresponding to the corresponding image time frame. At steps 218 it is determined whether the last image time frame has been processed, if not, the image frame number i is incremented at step 220, and steps 204-216 are repeated.

The steps illustrated in FIG. 4 can also be used to perform regularized GRAPPA reconstruction using data obtained in dynamic parallel imaging using temporal GRAPPA. Temporal GRAPPA is a procedure using a time-interleaved acquisition scheme, such as described in "Dynamic Autocalibrated Parallel Imaging Using Temporal GRAPPA (TGRAPPA)," by Breuer et al. in *Magnetic Resonance in Medicine* 53:981-985 (2005).

Figure 6A:
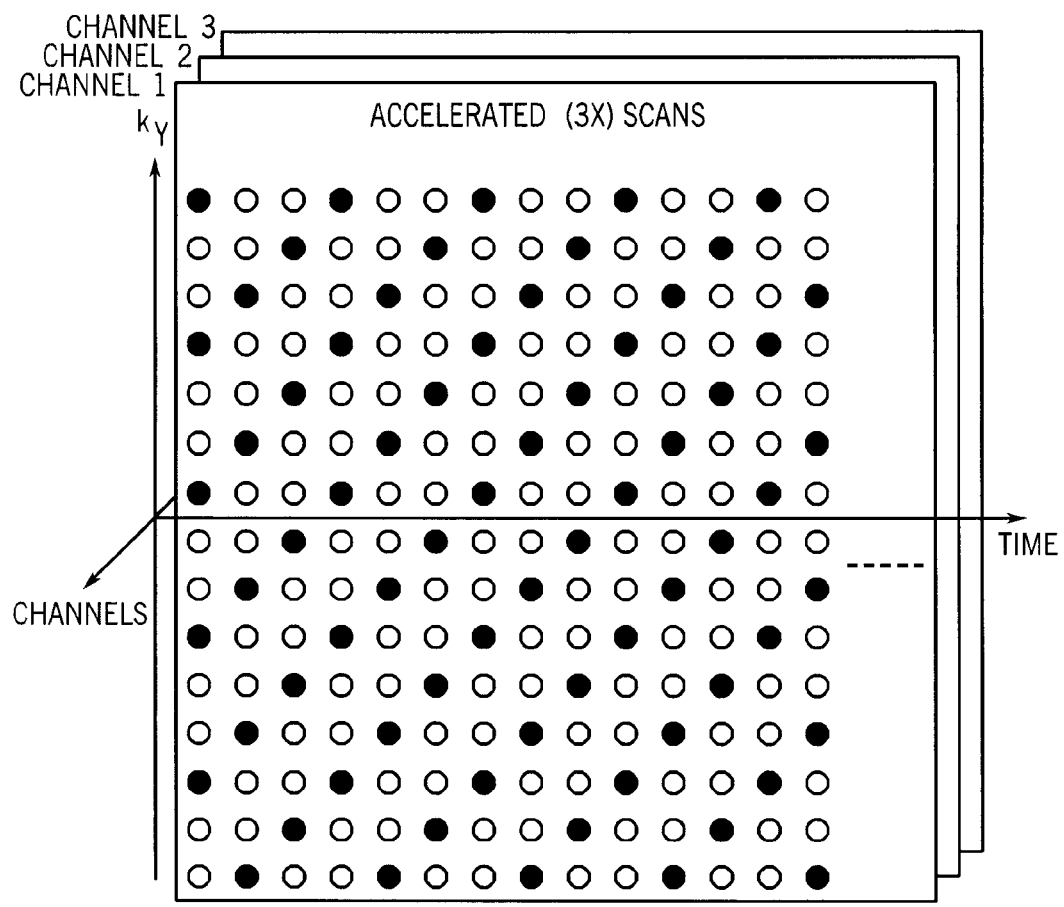
FIGS. 6(a)-6(e) are schematic k-space illustrations of reduced k-space data acquisition, preliminary data identification, temporal averaging calculation, ACS data grouping, and k-space data set reconstruction using the method of FIG. 4 and temporal GRAPPA.
Figure 6B:
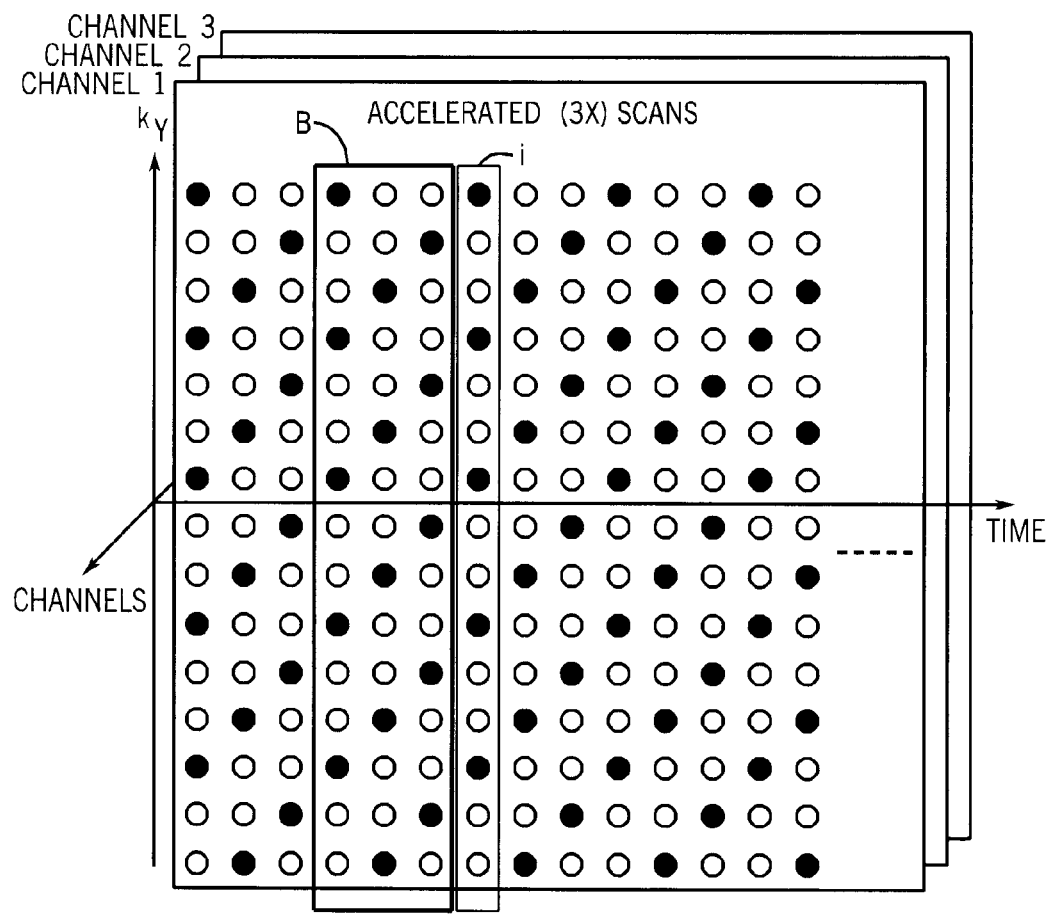
Figure 6C:
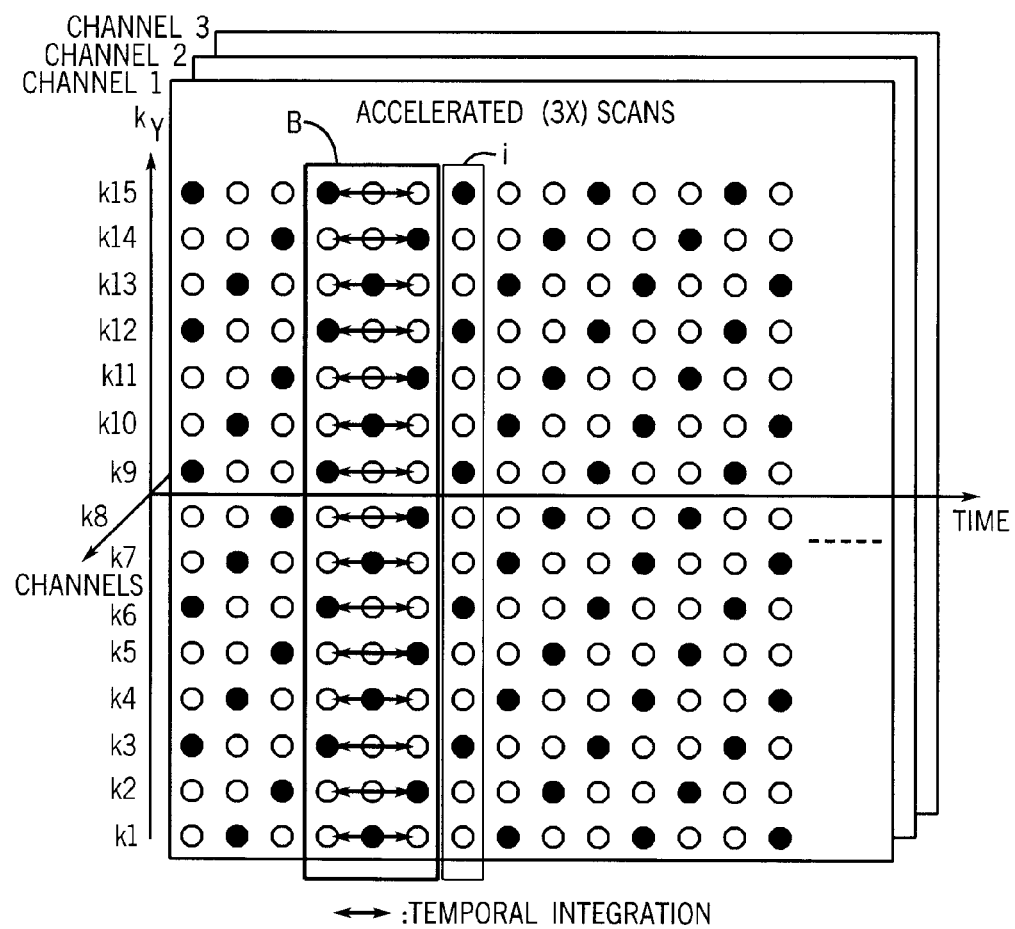

A time-interleaved acquisition scheme is illustrated in FIG. 6(a) for a reduction or acceleration factor of 3. In FIG. 6(a), sampled lines of k-space data are designated by solid circles, whereas unfilled circles represent lines of k-space that have not been acquired but are to be reconstructed. Here no autocalibration scan lines are directly acquired. Rather, as described in the Breuer article, directly adjacent time frames can be merged to build a fully encoded, full-resolution reference data set, which can then be used as autocalibration signals. This is illustrated in FIG. (b), wherein for time frame i, the three prior time frames are identified as block B. As shown in FIG. 6(c), the k-space data in the prior time frames in block B are temporally averaged in order to calculate autocalibration data for each of the k-space lines k1, k2, k4, k5, k7, k8, k10, k11, k13, and k14.

Figure 6D:
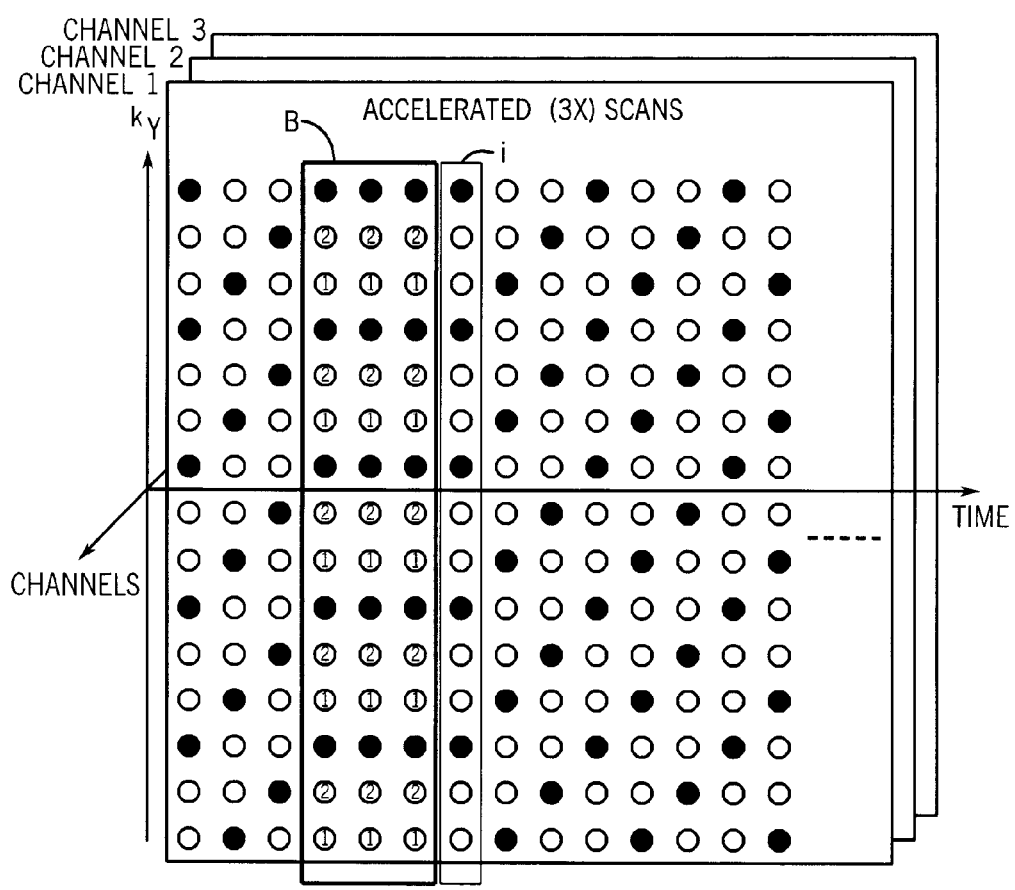
Figure 6E:
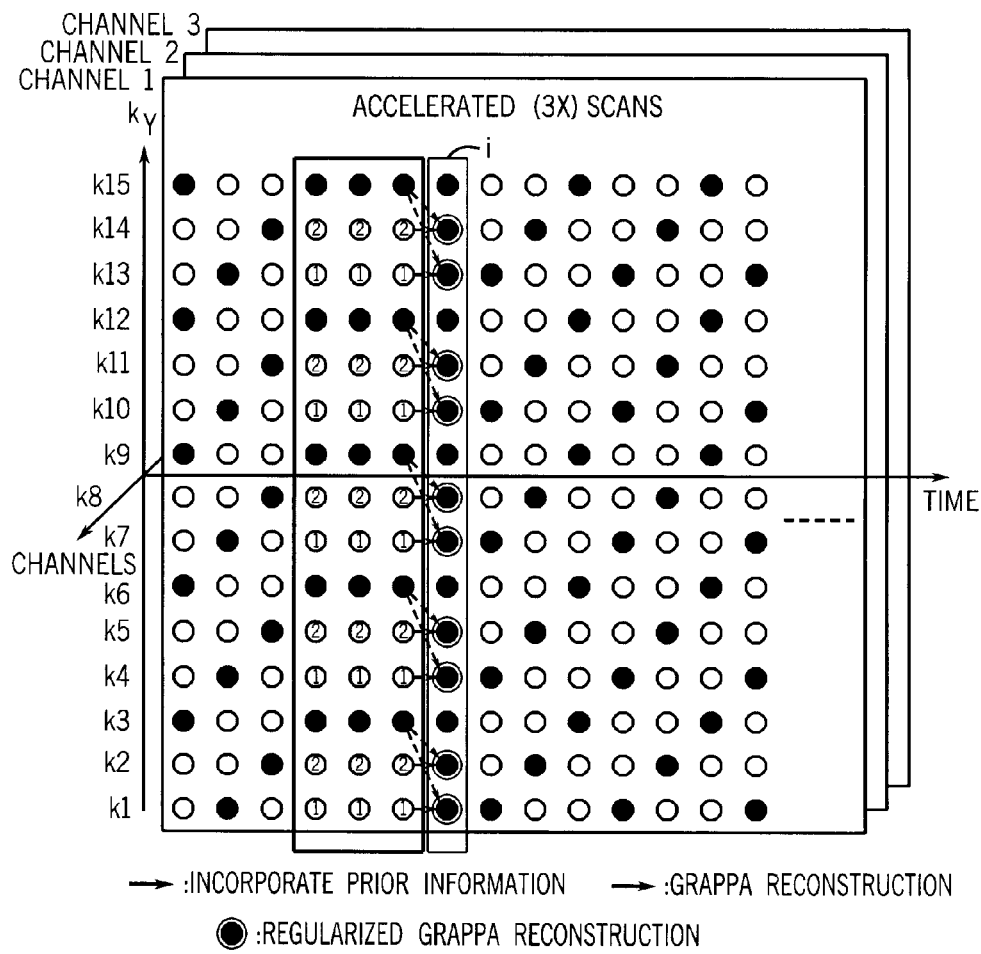

Once all relevant autocalibration data is obtained, as shown in FIG. 6(d), the ACS data (indicated as circles with numbers with) is assigned to different sets for GRAPPA reconstruction. As shown in FIG. 6(e), regularized GRAPPA reconstructions are performed to fill in the missing k-space data for the current image frame. The incorporation of prior information is indicated by a solid line arrow in FIG. 6(e), while the dashed line arrows indicate standard GRAPPA reconstruction. Thus, a circle with a dot within represents a line of unregularized GRAPPA reconstructed k-space data, and with a solid circle surrounded by another circle represents a line of regularized GRAPPA reconstructed k-space data.

In this example, the k-space lines k1, k2, k4, k5, k7, k8, k10, k11, k13, and k14 represent k-space data which is to be reconstructed using regularized GRAPPA reconstruction, since prior information from the prior time frames is available. In other words, the reconstructed k-space data for k-space lines k1, k2, k4, k5, k7, k8, k10, k11, k13, and k14 are constrained by using the prior information or autocalibration data for those lines as well as the accelerated scan data. In this case, no unregularized GRAPPA reconstructions are necessary.

TGRAPPA is advantageous because the ACS lines are generated rather than acquired, which further reduces scan time. Also, with every acquired data frame in the dynamic scan, a new set of ACS lines can be generated. In this manner, the coil coefficients are dynamically updated automatically and efficiently.

In other embodiments, a whitening procedure can optionally be performed on $A_{acc}$ and $\beta$. Whitening is the procedure to "equalize" the signal-to-noise ratio (SNR) sensitivity of different channels of an RF array in the reconstruction. Whitening is a desired procedure because it is possible that different channels have different SNRs and it is desirable to balance the fitting without relying on one specific channel. For example, if one channel is particularly noisy, it may be desirable to decrease the fitting error derived from that channel. Without performing whitening, an overall least squares fitting will tend to minimize the error in a particular noisy channel while neglecting other channels.

To perform whitening, the noise level first needs to be measured. This can be done by measuring the time series of all channels in an RF array after turning off the RF excitation. These time series can then be used to calculate the noise covariance matrix $\Psi$ in a conventional manner.

An eigenvalue decomposition of $\Psi$ is then performed to obtain V and $\Lambda$ where:

$$\Psi = V\Lambda V^H \qquad \text{Equation 13}$$

Then the whitened matrices $\tilde{\beta}$ and $\tilde{A}_{acc}$ are calculated:

$$\tilde{\beta} = \Lambda^{-1/2}V^H \beta \qquad \text{Equation 14}$$

$$\tilde{A}_{acc} = \Lambda^{-1/2}V^H A_{acc} \qquad \text{Equation 15}$$

Then the above equations 6-12 can be modified by substituting $\tilde{A}_{acc}$ for $A_{acx}$ and $\tilde{\beta}$ for $\beta$.

The present invention has been described in terms of one or more preferred embodiments, and it should be appreciated that many equivalents, alternatives, variations, and modifications, aside from those expressly stated, are possible and within the scope of the invention. For example, regularization parameter estimation methods other than an L-curve method can also be used. For example, truncated singular value decomposition (SVD) methods, or a pre-defined regularization constant, such as using a fixed fraction of total power in the singular value spectrum, are mathematically equivalent in the Tikhonov regularization framework. Other automatic regularization estimation methods, such as generalized cross validation (GVC), can be potentially used as well. Other ways are possible to obtain a compromise between an expected priori result and a result from inversion with no conditioning, such as maximal a posteriori (MAP) estimation in Stochastic Baynesian Modeling.

Further, while the k-space diagrams illustrate sampling k-space along Cartesian coordinates using a conventional pulse sequence in which each kspace line represents a different phase encoding value, these diagrams may also apply to pulse sequences that sample k-space in other, non-Cartesian, patterns. These may include, for example, spiral, shell and radial sampling patterns. Therefore, the invention should not be limited to a particular described embodiment.

The invention claimed is:

1. A method for generating a fully sampled k-space data set corresponding to each of a plurality of receiver channels in a parallel MRI system having a plurality of corresponding receiver coil elements, the fully sampled k-space data sets corresponding to an image of a scanned subject using the parallel MRI system, the method comprising:
   (a) performing an undersampled GRAPPA scan of the subject using the set of receiver coil elements and corresponding receiver channels to obtain a reduced k-space data set,
   (b) obtaining a plurality of autocalibration samples in k-space for each receiver channel,
   (c) calculating a reconstruction kernel from the plurality of autocalibration samples and the reduced k-space data set,
   (d) formulating a Tikhonov regularization framework to allow a tradeoff between reliance on a conventional GRAPPA reconstruction which uses the reconstruction kernel and a replication of the prior k-space data from the plurality of autocalibration samples, with the tradeoff determined by an optimal regularization parameter; and
   (e) reconstructing missing k-space data to obtain a reconstructed k-space data set which together with the reduced data set fully samples each channel of k-space, the missing k-space data being reconstructed using one of a regularized GRAPPA reconstruction using the Tikhonov regularization framework and a conventional GRAPPA reconstruction, wherein for locations in the reconstructed k-space data set which correspond to locations of autocalibration samples included in the plurality of autocalibration samples, a regularized GRAPPA reconstruction is performed, and wherein conventional GRAPPA reconstructions are performed if no prior k-space data is available.

2. The method of claim 1, wherein the optimal regularization parameter is determined using a L-curve method.

3. The method of claim 1, wherein the autocalibration samples are acquired during the same scan in which the reduced k-space data set is obtained.

4. The method of claim 1, wherein the autocalibration samples are lines acquired at the center of k-space.

5. The method of claim 1, wherein the autocalibration samples are calculated by temporally averaging prior acquired time frames of k-space data.

6. The method of claim 5, wherein the autocalibration samples are calculated for each missing k-space line in an accelerated scan such that a regularized GRAPPA reconstruction occurs for each missing k-space line.

7. The method of claim 1, wherein at step (a), a time series of reduced k-space data sets is obtained, and steps (b)-(e) are repeated for each reduced k-space data set.

8. A method for generating a fully samples k-space data set corresponding to each of a plurality of receiver channels in a parallel MRI system having a set of corresponding receiver coil elements, the fully samples k-space data sets corresponding to an image of a scanned subject using the parallel MRI system, the method comprising:
   (a) performing an undersampled scan of the subject using the set of receiver coil elements and corresponding receiver channels to obtain a reduced k-space data set $Y_{acc}$,
   (b) obtaining a plurality of autocalibration samples in k-space for each receiver channel, these autocalibration samples collectively denoted by $y_{acs}$,
   (c) calculating a reconstruction kernel $\beta$ from $y_{acs}$ and $Y_{acc}$,
   (d) calculating the pseudoinverse of $Y_{acc}$ to obtain $A_{acc}$,
   (e) reconstructing missing k-space lines to obtain a reconstructed k-space data set which together with $Y_{acc}$ fully samples each channel of k-space, each line being reconstructed using one of a regularized GRAPPA reconstruction and an unregularized GRAPPA reconstruction, wherein the locations in the reconstructed k-space data set which correspond to locations of autocalibration samples included in $y_{acs}$, a regularized GRAPPA reconstruction is performed to obtain a k-space matrix vector denoted by $y_{GRAPPA}$, wherein the regularized GRAPPA reconstruction uses a Tikhonov regularization framework to minimize a cost function that includes ($A_{acc} y_{GRAPPA} - \beta$) and $\lambda^2 (y_{GRAPPA} - y^0_{GRAPPA})$, where $\lambda^2$ is a regularization parameter having a determined optimal value and $y^0_{GRAPPA}$ is prior information, and wherein unregularized GRAPPA reconstructions are performed if no prior information is available.

9. The method of claim 8, wherein the optimal regularization parameter is determined by calculating a singular value decomposition of $A_{acc}$ and using an L-curve method.

10. The method of claim 9, wherein the L-curve method includes estimating current error $\rho$ and prior $\eta$, where:

$$\rho \equiv \|\beta - A_{acc} y^\rho_{GRAPPA}\| = \sum_{j=1}^{n} ((1-f_j) u_j^N \beta)^2 \text{ and } \eta \equiv \|y^\rho_{GRAPPA} - y^{0\rho}_{GRAPPA}\| = \sum_{j=1}^{n} \left( f_j \left( \frac{u_j^H \beta}{s_{jj}} - y^{\rho 0}_{jGRAPPA} \right) \right)^2,$$

where $y^{\rho 0}_{j\,GRAPPA}$ is the j-th element of prior $y^{\rho 0}_{GRAPPA}$, and where singular value decomposition is used to compute the left singular vectors $u_j$, right singular vectors $v_j$, and singular values $s_{jj}^2$ of $A_{acc}$ with the singular values and singular vectors indexed by j, such that fj is defined by $$f_j = \frac{s_{jj}^2}{s_{jj}^2 + \lambda^2}.$$

11. A method for generating a fully sampled k-space data set corresponding to each of a plurality of receiver channels in a parallel MRI system having a plurality of corresponding receiver coil elements, the fully sampled k-space data sets corresponding to an image of a scanned subject using the parallel MRI system, the method comprising:
   (a) performing an undersampled scan of the subject using the set of receiver coil elements to obtain a reduced k-space data set $Y_{acc}$,
   (b) obtaining a plurality of autocalibration samples in k-space for each receiver coil element, the autocalibration samples collectively denoted by $y_{acs}$,
   (c) calculating a reconstruction kernel $\beta$ from $y_{acs}$ and $Y_{acc}$,
   (d) calculating the pseudoinverse of $Y_{acc}$ to obtain $A_{acc}$,
   (e) determining a noise covariance matrix $\Psi$ among the set of receivers, (f) performing a whitening operation on $A_{acc}$ and $\beta$ using the eigenvalues of $\Psi$ to obtain $\tilde{A}_{acc}$ and $\tilde{\beta}$, (g) reconstructing missing k-space lines to obtain a reconstructed k-space data set which together with $Y_{acc}$ fully samples each channel of k-space, each line being reconstructed using one of a regularized GRAPPA reconstruction and an unregularized GRAPPA reconstruction, wherein for locations in the reconstructed k-space data set which correspond to locations of autocalibration samples included in $y_{acs}$, a regularized GRAPPA reconstruction is performed to obtain a k-space matrix vector denoted by $y_{GRAPPA}$, wherein the regularized GRAPPA reconstruction uses a Tikhonov regularization framework to minimize a cost function that includes ($\tilde{A}_{acc} y_{GRAPPA} - \tilde{\beta}$) and $\lambda^2(y_{GRAPPA} - y^0_{GRAPPA})$, where $\lambda^2$ is a regularization parameter having a determined optimal value and $y^0_{GRAPPA}$ is prior information, and wherein unregularized GRAPPA reconstructions are performed if no prior information is available.

12. The method of claim 11, wherein the optimal value for the regularization parameter is determined using an L-curve method.

13. The method of claim 11, wherein the optimal value for the regularization parameter is determined by calculating a singular value decomposition of $A_{acc}$ and using an L-curve method.

14. The method of claim 11, wherein the autocalibration samples $y_{acs}$ are acquired during the same scan in which the reduced k-space data set is obtained.

15. The method of claim 11, wherein the autocalibration samples are lines acquired at the center of k-space.

16. The method of claim 11, wherein the autocalibration samples are calculated by temporally averaging prior acquired time frames of k-space data.

17. The method of claim 16, wherein each missing k-space line is reconstructed using a regularized GRAPPA reconstruction.

18. The method of claim 11, wherein at step (a), a time series of reduced k-space data sets is obtained, and steps (b)-(g) are repeated for each reduced k-space data set.

19. A method for generating a fully sampled k-space data set corresponding to each of a plurality of receiver channels in a parallel MRI system having a plurality of corresponding receiver coil elements, the fully sampled k-space data sets corresponding to an image of a scanned subject using the parallel MRI system, the method comprising:

(a) performing an undersampled GRAPPA scan of the subject using the set of receiver coil elements and corresponding receiver channels to obtain a reduced k-space data set, (b) obtaining a plurality of autocalibration samples in k-space for each receiver channel, (c) calculating a reconstruction kernel from the plurality of autocalibration samples and the reduced k-space data set, (d) formulating a regularization framework to allow a tradeoff between reliance on a conventional GRAPPA reconstruction which uses the reconstruction kernel and a replication of the prior k-space data from the plurality of autocalibration samples, with the tradeoff determined by an optimal regularization parameter, and (e) reconstructing missing k-space data to obtain a reconstructed k-space data set which together with the reduced data set fully samples each channel of k-space, the missing k-space data being reconstructed using one of a regularized GRAPPA reconstruction using the regularization framework and a conventional GRAPPA reconstruction, wherein for locations in the reconstructed k-space data set which correspond to locations of autocalibration samples included in the plurality of autocalibration samples, a regularized GRAPPA reconstruction is performed, and wherein conventional GRAPPA reconstructions are performed if no prior k-space data is available.

20. The method of claim 19, wherein an image is reconstructed using the reconstructed k-space data set.

* * * * *

UNITED STATES PATENT AND TRADEMARK OFFICE
CERTIFICATE OF CORRECTION

PATENT NO. : 7,394,252 B1
APPLICATION NO. : 11/743739
DATED : July 1, 2008
INVENTOR(S) : Fa-Hsuan Lin It is certified that error appears in the above-identified patent and that said Letters Patent is hereby corrected as shown below:

Column 1, line 56, "form" should be --from--.

Column 1, line 60, "carriers" should be --carries--.

Column 2, line 20, "difference" should be --different--.

Column 3, line 33, "k-space reconstruction" should be --k-space data reconstruction--.

Column 3, line 59, "precessor" should be --processor--.

Column 3, line 59, "serves" should be --servers--.

Column 4, line 16, "pules" should be --pulses--.

Column 4, line 26, "NRM" should be --NMR--.

Column 5, line 48, "6(a-6(e)" should be --6(a)-6(e)--.

Column 6, line 20, "transposed" should be --transpose--.

Column 7, Eq. 6, " $A_{acc} y^{p}_{GRAPPA}$ " should be -- $A_{acc} y_{GRAPPA}^{p}$ --.

Column 7, Eq. 7, " $y^{p}_{GRAPPA} - y^{0p}_{GRAPPA}$ " should be -- $y_{GRAPPA}^{p} - y^{0}_{GRAPPA}{}^{p}$ --.

Column 7, line 31, "not" should be -- no--.

Column 8, line 61, "170" should be --107--.

Column 10, line 40, " $\beta$ " should be -- $\tilde{\beta}$ --.

Column 10, line 41, " $\beta$ " should be -- $\tilde{\beta}$ --.

UNITED STATES PATENT AND TRADEMARK OFFICE
CERTIFICATE OF CORRECTION

PATENT NO.        : 7,394,252 B1
APPLICATION NO. : 11/743739
DATED             : July 1, 2008
INVENTOR(S)       : Fa-Hsuan Lin It is certified that error appears in the above-identified patent and that said Letters Patent is hereby corrected as shown below:

Column 10, line 46, " $\beta$ " should be -- $\tilde{\beta}$ --.

Column 11, Claim 1, line 42, "a" should be --an--.

Column 11, Claim 8, line 58, "samples" should be --sampled--.

Column 11, Claim 8, line 61, "samples" should be --sampled--.

Column 12, Claim 8, line 11, "wherein the" should be --wherein for--.

Column 12, Claim 10, line 31, " $y^\rho_{GRAPPA}$ " should be -- $y_{GRAPPA}{}^\rho$ --.

Column 12, Claim 10, line 33, " $y^\rho_{GRAPPA} - y^{0\rho}{}_{GRAPPA}$ " should be -- $y_{GRAPPA}{}^\rho - y^0{}_{GRAPPA}{}^\rho$ --.

Column 13, Claim 11, line 15 " $\beta$ " should be -- $\tilde{\beta}$ --.

Signed and Sealed this

Twenty-sixth Day of August, 2008

JON W. DUDAS
*Director of the United States Patent and Trademark Office*